United States Patent [19]

Gergis

[11] 4,403,304
[45] Sep. 6, 1983

[54] REPLICATOR FOR ION-IMPLANTED BUBBLE DOMAIN DEVICES

[75] Inventor: Isoris S. Gergis, Yorba Linda, Calif.

[73] Assignee: Rockwell International Corporation, El Segundo, Calif.

[21] Appl. No.: 239,233

[22] Filed: Mar. 2, 1981

[51] Int. Cl.³ .............................................. G11C 19/08
[52] U.S. Cl. ........................................ 365/12; 365/36; 365/41
[58] Field of Search ........................ 365/12, 16, 36, 41

[56] References Cited

U.S. PATENT DOCUMENTS 4,249,249 2/1981 Bonyhard et al. ..................... 365/36
4,253,159 2/1981 Nelson .

OTHER PUBLICATIONS

"Ion-Implanted Bubble Circuit Function Design (Invited)", by T. J. Nelson et al., Bell Laboratories, 1980 IEEE.

Primary Examiner—James W. Moffitt
Attorney, Agent, or Firm—H. Frederick Hamann; Daniel R. McGlynn

[57] ABSTRACT

A replicator for a magnetic bubble domain device including a hairpin loop conductor element traversing first and second spaced apart bubble domain guide structures. The replicator functions to replicate a bubble domain travelling along the first bubble propagation path onto the second bubble propagation path in response to an activating signal on the conductor. The replicate guide structure includes two attractive cusp positions and one repulsive cusp position, so that the repulsive charged wall formed at the repulsive cusp position functions to sever a stretched bubble domain formed by the activating signal.

9 Claims, 5 Drawing Figures

REPLICATOR FOR ION-IMPLANTED BUBBLE DOMAIN DEVICES

TECHNICAL FIELD OF THE INVENTION

The invention relates to magnetic bubble domain devices and in particular to bubble domain replicators for duplicating or replicating a magnetic bubble in a propagation path.

BACKGROUND OF THE INVENTION

Magnetic bubble domain devices are well known in the art. There are two basic types of devices depending upon the method by which bubbles are propagated in bubble devices; the first is the field access type and the second is the current (or conductor) access type. The most familiar mode of operating a magnetic bubble device is termed the "field-access" mode. In this mode, a pattern of magnetically soft elements (such as Permalloy or ion implanted contiguous disks) is formed in a plane adjacent a layer of material in which the bubbles are moved. The bubble layer is typically a thin magnetic garnet film disposed on a suitable non-magnetic substrate. A magnetic field is generated in the plane of the layer and the field caused to reorient to incrementally-offset radial positions cyclically in the plane. Each element is so shaped that various portions thereof respond to in-plane field to generate pole-patterns which change as the field precesses. The configuration of adjacent elements sets up a sequence of travelling potential wells in the layer which causes bubble movement.

In current access devices, the necessary potential wells are provided by a set of conductor patterns in which polyphase, usually two or three phase, currents are transmitted. The conductors are typically formed in multiple layers, insulated from one another and driven in a two or three phase manner. An example of such a device is described in U.S. Pat. No. 3,460,116.

Various types of magnetic bubble domain device architectures are known in the prior art, one of the best known being the major loop/minor loop configuration. The major loop/minor loop configuration, such as described in U.S. Pat. No. 3,618,054, consists of a plurality of first recirculating "minor" channels and a second "major" channel.

Bubble replication is achieved in permalloy field access bubble devices by stretching the bubble then cutting it into two parts, one part is left in the primary track and the second is transferred to the secondary tracks. The bubble stretching is performed either by applying a high current pulse to the same conductor used for cutting the bubble or by utilizing some large size permalloy propagation elements such as the pickax element. Ion-implanted field access devices, however, lack the strong wide pole distribution necessary for stretching bubbles for successful replication over adequate bias range. Prior to the present invention, there has not been a simple and reliable replicator for use with ion-implanted devices.

SUMMARY OF THE INVENTION

Briefly and in general terms, the invention concerns a replicator for magnetic bubble domain devices including first ion-implanted track for receiving and propagating a magnetic bubble domain, an expander which intersects the first track and functions to expand the bubble domain in a first direction, and a replication device which intersects the expander and functions to cut the expanded bubble into two magnetic bubble domains, so that the replicated bubble domain travels along a second ion-implanted path.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENT

The present invention is concerned with replicators for magnetic bubble domain devices of the ion-implanted field access type. The operation of the replicator according to the present invention is based upon making use of the charged walls of bubble domains which are responsible for bubble propagation and which are good candidates to perform the cutting function if properly implemented in the replicator design.

The present invention describes two embodiments of bubble replicators in which the stretching is performed by a hairpin conductor loop and the cutting is made by a charged wall with the assistance of the confining field of the conductor loop.

Figure 1:
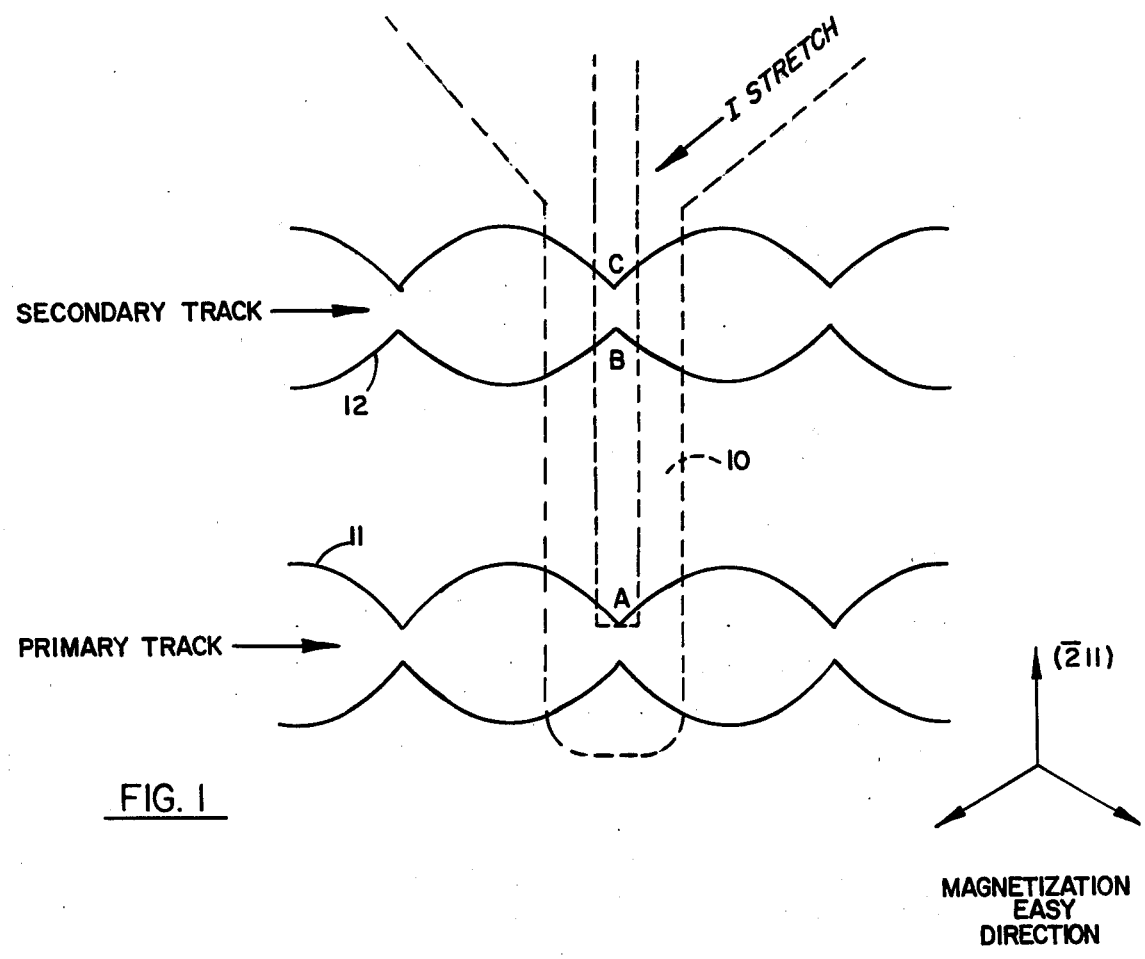
FIG. 1 is a top plan view of a bubble domain device which illustrates a first embodiment of the replicator according to the present invention.

FIG. 1 illustrates the first embodiment of the present invention wherein the repulsive charged wall responsible for cutting the bubble is parallel to the conductor loop. FIG. 1 is a top plan view of a bubble domain device which includes a planar layer of magnetic material A in which magnetic bubble domains can be propagated, such as magnetic garnet film. A first bubble domain guide structure, labelled "primary track" in the Figure, is provided which is coupled to said layer and defines the first bubble domain propagation path for guiding the movement of bubble domains in the layer in response to a cyclical change in orientation of a re-orienting magnetic field in the plane of the layer.

A second bubble domain guide structure, labelled "secondary track" in FIG. 1, is provided which is coupled to the planar layer of magnetic material and defines a second propagation path for guiding the movement of other bubble domains in the layer in response to cyclical change in the orientation of the re-orienting magnetic field in the plane of the layer. The crystallographic axes or the easy directions of magnetization of the planar layer of magnetic material are shown by the schematic diagram in the lower right hand portion of FIG. 1. In the present embodiment, the bubble domain guide structures are formed by ion implantation of the magnetic garnet film. The particular guide structure illustrated is an overlapping pattern of colinear contiguous disks, although the present invention is not limited to any particular structure.

The invention further provides a replicate bubble domain guide structure also coupled to the planar layer of magnetic material and implemented in the embodiment shown in FIG. 1 as a hairpin loop 10 of conductor material which is coupled to the magnetic layer. It is noted that the long axes of the hairpin loop is oriented in substantially the same direction as one of the crystallographic axes of the planar layer. Such a configuration is important since, as will be explained subsequently, the location and bubble potential of the cusps A, B, and C are a function of both the crystallographic axes as well as the direction of the in-plane rotating field at a particular point in the timing cycle. An I-stretch current pulse, shown in FIG. 3b, is provided in the hairpin loop 10 during an appropriate portion of the timing cycle of the re-orienting magnetic field in the plane of the layer, so that the replicate structure functions to replicate a bubble domain travelling along the primary track and reproducing it onto the secondary track in response to an activating signal represented by a current in the hairpin loop 10. Further details concerning the operation of the hairpin loop 10 will be described subsequently.

Figure 2:
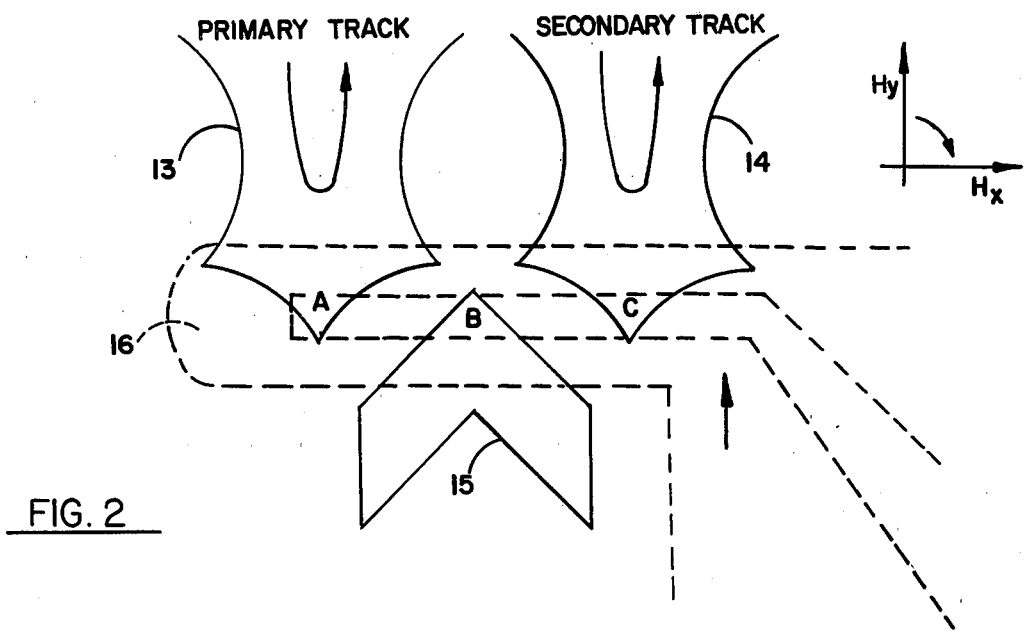
FIG. 2 is a top plan view of a bubble domain device which illustrates a second embodiment of a replicator according to the present invention.

FIG. 2 is a top plan view of a bubble domain device which illustrates a second embodiment of the replicated design according to the present invention. The primary track 13 and the secondary track, 14, have a somewhat different shape and configuration in the second embodiment of FIG. 2 than in the first embodiment. An additional chevron element 15 is provided which forms a portion of the replicate structure according to the present invention. The hairpin loop 16 is similar to the hairpin loop 10 the embodiment of FIG. 1, but has a different orientation with respect to the primary and secondary tracks as well as with respect to the additional element 15. The orientation of the easy directions of magnetization, or the crystal axis, is the same in FIG. 2 as is shown in the lower right hand portion of FIG. 1.

The arrows shown in the primary track 13 and in the secondary track 14 show the direction of bubble movement in the primary track and secondary track, respectively, in response to a re-orienting magnetic field in the plane of the layer. The essential difference between configurations of FIG. 1 and FIG. 2 is that in FIG. 1 the repulsive charge wall responsible for cutting the bubble is essentially parallel to the conductor loop, while in FIG. 2 the charge wall is essentially perpendicular to the conductor loop, i.e., to the stretched bubble or stripe domain.

As pointed out above, the operation of the replicator according to the present invention, is based upon the interaction of charged walls at specific cusp positions A, B, and C in FIGS. 1 and 2, of the bubble domain guide structures formed by ion implanted regions in the planar layer of magnetic material.

The orientation of the crystallographic axes as shown in FIG. 1, correspond to the easy (or preferred) directions of the in-plane magnetization in the implanted layer. With the in-plane field pointing downward, the charged walls in cusps A and C will be especially strong and attractive to the bubble. The charged wall in cusp B will also be strong, but of opposite polarity, i.e., repulsive to the bubble.

The operation of the replicator can be explained making reference to the timing diagrams 3a, 3b, and 3c.

Figure 3A:
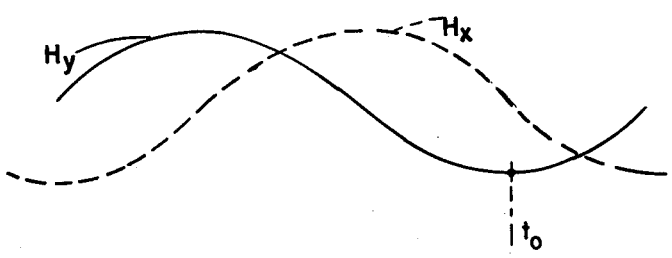
FIG. 3a is a timing diagram of the in-plane magnetic drive field as used in the present invention.
Figure 3B:
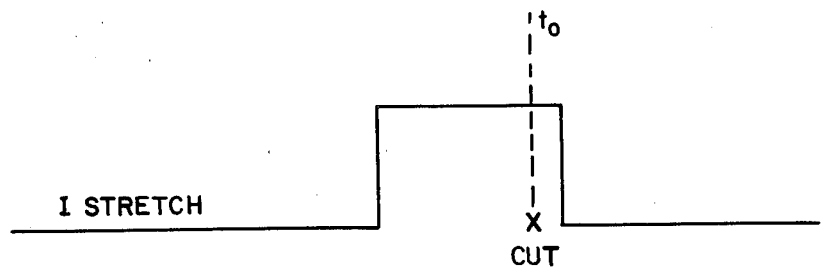
FIG. 3b is a timing diagram of the current in the conductor according to the present invention.

FIG. 3a is a timing diagram of the in-plane magnetic drive field as used in the present invention, with the in-plane field pointing in the +X direction, a current pulse is applied to the conductor loop and a bubble in cusp A is stretched into a stripe domain all the way. At this field phase, the cusps A, B, and C are neutral (no charged walls). The I-stretch current pulse is sustained until a little beyond $t_o$, corresponding to the −Y direction of the in-plane field. During the I-stretch current pulse interval, cusps A and C become increasingly attractive and cusp B becomes increasingly repulsive. At approximately $t_o$, the (−Y) phase, the repulsive charged wall at B will sever the bubble stripe. Upon the termination of the current pulse, the two domains shrink back into two distinct bubbles, one bubble at A and one bubble at C. The replication is thus completed.

Figure 3C:
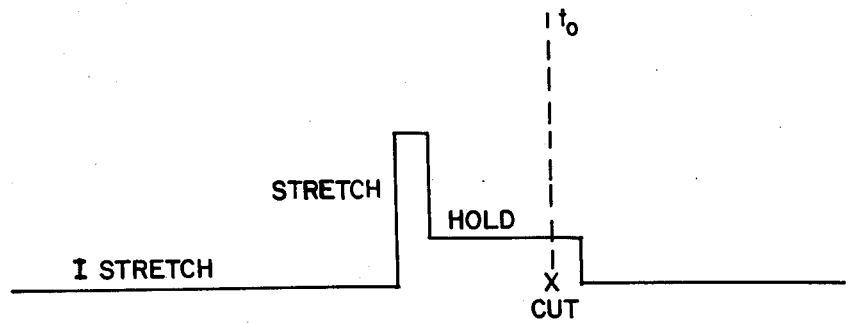
FIG. 3c is the timing diagram of an alternative stretch and hold current waveform that can be used in the present invention.

It should be noted that the stretch current amplitude can be reduced once the bubble is fully stretched between the attractive cusps A and C, and such an alternative current waveform is shown in FIG. 3c. The value of the peak current plateau, (i.e., the amplitude of the pulse of FIG. 3b) should be large enough to sustain the bubble stripe (i.e., to prevent the stripe from shrinking back into a bubble), as well as to confine the stripe at cusp B for successful cutting. The advantage of reducing the current amplitude after the stripe is formed is to facilitate the cutting process, since the field of the repulsive charged wall has to overcome the attractive field due to the current in the loop, and yet provide a large enough field to cut the bubble.

In addition to the embodiments using ion-implanted contiguous disks described above, the invention may also be implemented with a wide variety of element geometries. The prior art includes a number of more complicated ion-implanted propagation structures which can be used as either the first or second elements (major or minor loops). For example, Nelson et al, of Bell Labs recently described a major loop design composed of alternating inside and outside corners which may be useful (Intermag Conference, Boston, Mass., April 1980).

While the invention has been illustrated and described as embodied in a replicator for ion-implanted bubble domain devices, it is not intended to be limited to the details shown, since various modifications and structural changes may be made without departing in any way from the spirit of the present invention.

It will be obvious to those skilled in the art that the magnetic bubble device according to the present invention can be manufactured with various lithographic technologies and different combinations of known process steps, and that the preferred embodiments illustrated here are merely exemplary. The composition, architecture and geometric configuration of the guide elements, and the layout and distance between the propagation paths, as well as the distance to the magnetic bubble guide elements, as well as their distance to the magnetic bubble layer, can be chosen depending upon the desired properties. These and other variations can be further elaborated by those skilled in the art without departing from the scope of the present invention.

The present invention is also not restricted to the specific magnetic materials and circuits described. For example, it may be pointed out that magnetic materials other than garnet, for example hexagonal ferrites or various crystalline compounds may be used. Moreover, the source, orientation, and frequency of the magnetic field, and the static or dynamic nature of the signals applied to the device may be suitably selected as desired for a particular application.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A magnetic bubble domain device comprising:
   a planar layer of magnetic material in which magnetic bubble domains can be propagated;
   a first bubble domain guide structure coupled to said layer and defining a first bubble domain propagation path for guiding the movement of said bubble domains in said layer in response to a cyclical change in the orientation of a re-orienting magnetic field within the plane of said layer;
   a second bubble domain guide structure coupled to said layer, and defining a second propagation path for guiding the movement of said bubble domains in said layer in response to the cyclical change in orientation of said reorienting magnetic field in the plane of said layer;
   a replicate bubble domain guide structure coupled to said layer and functioning to replicate a bubble domain travelling along said first bubble propagation path onto said second bubble propagation path in response to an activating signal, characterized in that said replicate guide structure includes two attractive cusp positions and one repulsive cusp position, the repulsive charged wall formed at said repulsive cusp position functioning to sever a stretched bubble domain formed by said activating signal.

2. A device as defined in claim 1 wherein said first propagation path comprises ion implanted contiguous disks.

3. A device as defined in claim 1 wherein said ion implanted contiguous disks comprise a pattern of overlapping co-linear contiguous disks.

4. A device as defined in claim 1 wherein said cusp position is defined as a pointed concave portion of an ion-implanted propagation path element of said device.

5. A device as defined in claim 1 wherein said replicate bubble domain guide structure comprises a hairpin loop, the axis of said loop extending substantially in one of the easy directions of magnetization of said planar layer of magnetic material.

6. A device as defined in claim 1 wherein said replicate bubble domain guide structure comprises a hairpin loop having a long axis substantially perpendicular to one of the easy axes of magnetization of said planar layer of magnetic material.

7. A magnetic bubble domain device comprising:
   a planar layer of magnetic material in which magnetic bubble domains can be propagated;
   a first bubble domain guide structure coupled to said layer and defining a first bubble domain propagation path for guiding the movement of said bubble domains in said layer in response to a cyclical change in the orientation of a re-orienting magnetic field within the plane of said layer;
   a second bubble domain guide structure coupled to said layer, and defining a second propagation path for guiding the movement of said bubble domains in said layer in response to the cyclical change in orientation of said reorienting magnetic field in the plane of said layer;
   a replicate bubble domain guide structure coupled to said layer including means for stretching a bubble domain travelling along said first bubble propagation path into a bubble domain that extends from said first to said second bubble propagation path in response to first activating signal, and means for forming first and second bubble domain attractive positions and a single bubble domain repulsive position between said attractive positions in response to a second activiting signal, the repulsive position functioning to sever said stretched bubble domain formed by said first activating signal.

8. A magnetic bubble domain system comprising:
   a planar layer of magnetic material in which magnetic bubble domains can be propagated;
   a bubble domain guide structure coupled to said layer for guiding the movement of bubble domains in said layer; said guide structure including first and second spaced apart bubble domain guide structures coupled to said layer and defining a first bubble domain propagation path for guiding the movement of said bubble domains in said layer in response to a cyclical change in the orientation of a re-orienting magnetic field within the plane of said layer;
   replicate means disposed between said first and said second guide structures for replicating bubble domains therebetween;
   characterized in that said replicate means includes first and second attractive cusp positions and a repulsive cusp position disposed to sever a stretched bubble domain extending between said first and said second guide structures such that the direction of the bubble stretching between said first guide structure and said second guide structure is substantially perpendicular to the direction of the easy axes of magnetization of the planar layer.

9. A magnetic bubble domain system comprising:
   a planar layer of magnetic material in which magnetic bubble domains can be propagated;
   a bubble domain guide structure coupled to said layer for guiding the movement of bubble domains in said layer; said guide structure including first and second spaced apart bubble domain guide structures coupled to said layer and defining a first bubble domain propagation path for guiding the movement of said bubble domains in said layer in response to a cyclical change in the orientation of a re-orienting magnetic field within the plane of said layer;
   replicate means disposed between said first and said second guide structures for replicating bubble domains therebetween;
   characterized in that said replicate means includes first and second attractive cusp position and a repulsive cusp position disposed to sever a stretched bubble domain extending between said first and said second guide structures such that the direction of the bubble stretching between said first guide structure and said second guide structure is substantially the same direction to the direction of the easy axes of magnetization of the planar layer.

* * * * *